US011343949B2

United States Patent
Cheng et al.

(10) Patent No.: US 11,343,949 B2
(45) Date of Patent: May 24, 2022

(54) APPARATUS AND METHOD FOR DISPENSING A VISCOUS ADHESIVE

(71) Applicant: ASM Technology Singapore Pte Ltd, Singapore (SG)

(72) Inventors: Chi Wah Cheng, Hong Kong (HK); Wan Yin Yau, Hong Kong (HK)

(73) Assignee: ASM TECHNOLOGY SINGAPORE PTE LTD, Singapore (SG)

( * ) Notice: Subject to any disclaimer, the term of this patent is extended or adjusted under 35 U.S.C. 154(b) by 457 days.

(21) Appl. No.: 15/919,364

(22) Filed: Mar. 13, 2018

(65) Prior Publication Data
US 2019/0289760 A1      Sep. 19, 2019

(51) Int. Cl.
| | |
|---|---|
| *H05K 13/04* | (2006.01) |
| *B05C 5/02* | (2006.01) |
| *B05B 1/34* | (2006.01) |
| *H01L 21/67* | (2006.01) |
| *B05C 11/10* | (2006.01) |

(52) U.S. Cl.
CPC ........... *H05K 13/0469* (2013.01); *B05B 1/34* (2013.01); *B05C 5/0225* (2013.01); *B05C 11/1034* (2013.01); *H01L 21/6715* (2013.01); *H01L 21/67023* (2013.01)

(58) Field of Classification Search
CPC ...... B05B 1/34; B05C 5/0225; B05C 11/1034
See application file for complete search history.

(56) References Cited

U.S. PATENT DOCUMENTS

| | | | | |
|---|---|---|---|---|
| 6,955,946 | B2 * | 10/2005 | Bouras | B05C 11/101 |
| | | | | 118/666 |
| 9,701,143 | B2 | 7/2017 | Ikushima | |
| 2010/0156970 | A1 * | 6/2010 | Ikushima | B05B 12/06 |
| | | | | 347/8 |
| 2012/0039524 | A1 * | 2/2012 | Linnenkohl | G06K 9/32 |
| | | | | 382/145 |

FOREIGN PATENT DOCUMENTS

TW      200914149 A      4/2009

OTHER PUBLICATIONS

Taiwan Office Action, dated Jan. 10, 2020, issued in corresponding Taiwanese Patent Application No. 108107233. Includes English translation. Total 19 pages.

* cited by examiner

*Primary Examiner* — Kelly M Gambetta
(74) *Attorney, Agent, or Firm* — Ostrolenk Faber LLP

(57) ABSTRACT

An apparatus and a method for dispensing a viscous adhesive for attaching a semiconductor die onto a substrate are provided, where the method comprises the steps of dispensing a volume of viscous adhesive from a nozzle onto the substrate and moving the nozzle away from the substrate such that an adhesive tail is formed between the nozzle and the volume of viscous adhesive. The method further comprises the steps of capturing multiple images of the adhesive tail with an imaging device as the nozzle is moving away from the substrate with an imaging device; and thereafter detecting with the imaging device an instant when the adhesive tail breaks from the volume of viscous adhesive.

12 Claims, 5 Drawing Sheets

FIG. 3A  FIG. 3B

APPARATUS AND METHOD FOR DISPENSING A VISCOUS ADHESIVE

FIELD OF THE INVENTION

The present invention relates to an apparatus and method for dispensing a viscous adhesive. In particular, such adhesive may be dispensed for the purpose of attaching a semiconductor die onto a substrate.

BACKGROUND

A process for attaching a semiconductor die onto a substrate carrier involves a vacuum tool picking up the semiconductor die from a singulated wafer comprising a matrix of semiconductor dice and then attaching the said semiconductor die onto the substrate with an adhesive, such as epoxy.

In such semiconductor die attach applications using epoxy, a drop of epoxy is dispensed at high speed onto the substrate before the semiconductor die is placed on top of the drop of dispensed epoxy. Thereafter, the substrate and the semiconductor die are heated to an elevated temperature to cure the epoxy, thus securely attaching the semiconductor die to the substrate.

Optimizing the step of dispensing the epoxy is therefore one of the key factors in achieving an effective die attachment process. Hence, the parameters that affect the quality of the epoxy dispensed should be optimized. These include "pull-up speed" (the speed at which a dispenser is pulled upwards), "pull-up distance" (the distance for which a dispenser is pulled upwards) and "delay" (the period at which a dispenser is at rest after pulling upwards).

An operator normally goes through a lengthy process of trial and error to optimize the aforesaid and other parameters, which is not only inefficient but is also wasteful. Moreover, the optimization of the epoxy dispensing step is complicated by the fact that it is desirable for the epoxy to be dispensed at high speeds to increase throughput. There is currently no way for the operator to visually monitor in real-time the high-speed epoxy dispensing process, which may take place at a rate of more than ten drops of epoxy dispensed per second. Thus, the inspection process is inherently subjective, being solely an exercise of judgment on the part of the operator.

Hence, it would be beneficial to seek to provide a method of dispensing adhesive for attaching a semiconductor die to a substrate which ameliorates at least some of the aforementioned disadvantages of the prior art.

SUMMARY OF THE INVENTION

It is thus an object of this invention to seek to provide an apparatus and method of dispensing adhesive for attaching a semiconductor die to a substrate which allows improved control of the dispensing process.

According to a first aspect of the invention, there is provided a method of dispensing a viscous adhesive for attaching a semiconductor die onto a substrate, the method comprising the steps of dispensing a volume of viscous adhesive from a nozzle onto the substrate; moving the nozzle away from the substrate such that an adhesive tail is formed between the nozzle and the volume of viscous adhesive; capturing multiple images of the adhesive tail with an imaging device as the nozzle is moving away from the substrate with an imaging device; and thereafter detecting with the imaging device an instant when the adhesive tail breaks from the volume of viscous adhesive.

According to a second aspect of the invention, there is provided an adhesive dispenser module for dispensing a viscous adhesive for attaching a semiconductor die onto a substrate, the adhesive dispenser module comprising a nozzle postionable above the substrate for dispensing a volume of viscous adhesive onto the substrate; an imaging device mounted in a fixed relationship with respect to the nozzle such that the imaging device is movable together with the nozzle, the imaging device being operative to capture multiple images of an adhesive tail formed between the nozzle and the volume of viscous adhesive as the nozzle is moving away from the substrate after dispensing the volume of viscous adhesive.

These and other features, aspects, and advantages will become better understood with regard to the description section, appended claims, and accompanying drawings.

BRIEF DESCRIPTION OF THE DRAWINGS

Embodiments of the present invention will now be described, by way of example only, with reference to the accompanying drawings, in which.

In the drawings, like parts are denoted by like reference numerals.

DETAILED DESCRIPTION OF THE PREFERRED EMBODIMENT OF THE INVENTION

Figure 1:
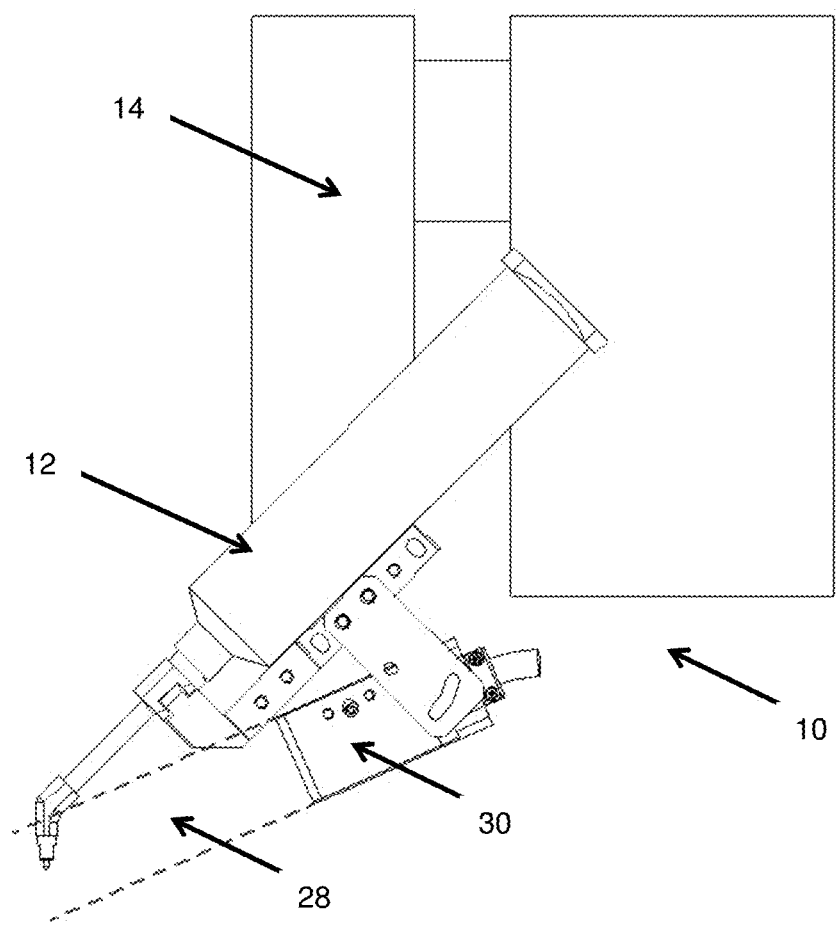
FIG. 1 shows a side view of an adhesive dispenser module according to the preferred embodiment of the present invention.

FIG. 1 shows a side view of an adhesive dispenser module 10 according to the preferred embodiment of the present invention. The adhesive dispenser module 10 comprises an adhesive dispenser 12 attached onto an XYZ positioning bracket 14, which is movable along each of the X, Y, and Z axes. Thus, when the XYZ positioning bracket 14 moves, the adhesive dispenser 12 is moved together with it. A camera 30 is mounted onto the adhesive dispenser 12 in a fixed relationship with respect to the adhesive dispenser 12, thus allowing it to move together with the adhesive dispenser 12.

Figure 2:
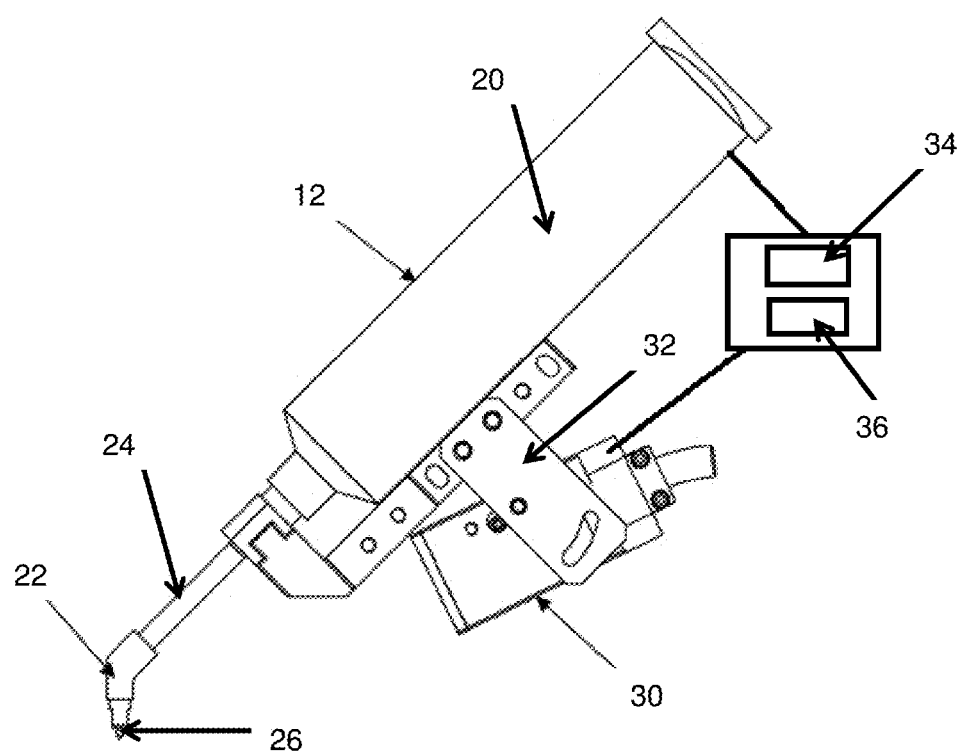
FIG. 2 shows a side view of the adhesive dispenser highlighting its control aspects.

FIG. 2 shows a side view of the adhesive dispenser 12 highlighting its control aspects. The adhesive dispenser 12 comprises an adhesive chamber 20 connected to a dispensing nozzle 22 via a tube 24. The adhesive chamber 20 is inclined at an oblique angle to the horizontal, and it is configured to contain a supply of adhesive or epoxy. The tube 24, also inclined at an oblique angle to the horizontal, fluidly connects the adhesive chamber 20 to the dispensing nozzle 22. Thus, the adhesive is able to flow from the adhesive chamber 20 through the tube 24 to the dispensing nozzle 22. A dispensing tip 26 at a terminating end of the dispensing nozzle 22 is directed vertically downwards in such a way that the adhesive is ejected or dispensed downwards from the dispensing tip 26.

The camera 30 is rigidly fixed to the adhesive dispenser 12 with a mounting plate 32 in such a manner that the dispensing nozzle 22, as well as the dispensing tip 26, is within the field of view 28 of the camera 30. The camera 30 is positioned to capture a side-view image of the adhesive dispensed from the dispensing tip 26 and to detect an occurrence of an adhesive tail break. The dispensing tip 26 is, therefore, always within the field of view 28 of the camera 30, even while the dispensing nozzle 22 is moving. In other words, the camera 30, as well as the adhesive dispenser 12, move together while driven by the XYZ positioning bracket 14.

The camera 30, which is configured to detect in real-time the occurrence of an adhesive tail break during a high speed adhesive dispensing process, may be a high speed camera capable of recording at up to a few thousand frames per second, for example, 1500 frames per second. The camera 30 may further comprise a processor 34 and memory 36, which may both be embedded in the camera 30 itself for faster processing of the images taken. This avoids the need for image signals to be transferred from the camera 30 to a separate computer for processing the image signals, thus reducing drastically the image processing and response times.

Figure 3:
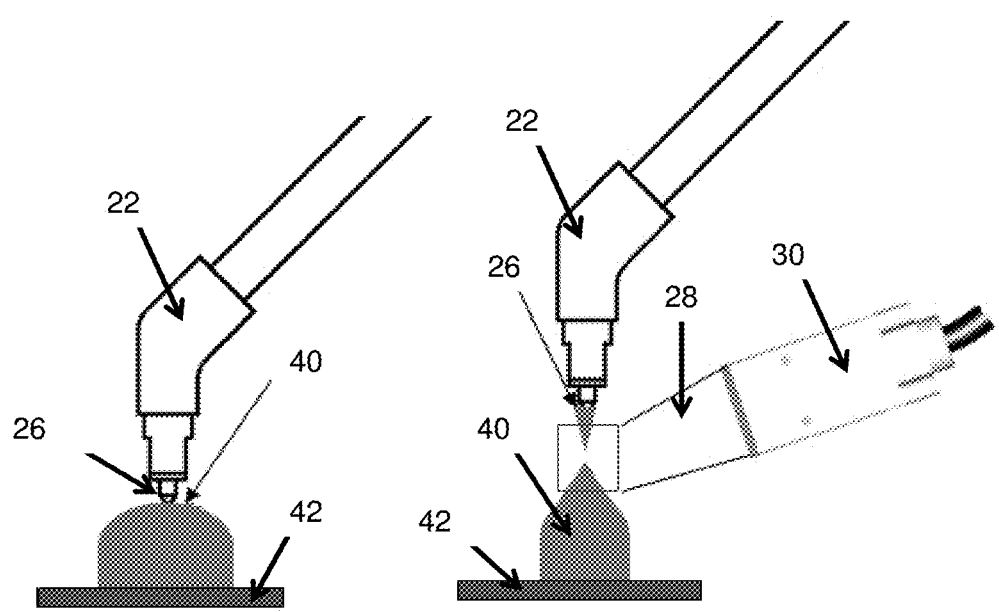
FIGS. 3A and 3B respectively illustrate side views of a dispensing nozzle before and after an adhesive tail break respectively.

FIGS. 3A and 3B respectively illustrate side views of the dispensing nozzle 22 before and after an adhesive tail break respectively. FIG. 3A shows a drop of adhesive 40 dispensed from the dispensing tip 26 onto a substrate 42 to form a bead. Thereafter, the dispensing nozzle 22 moves up by a predetermined distance, whereupon an adhesive tail connected to the adhesive bead is formed between the dispensing tip 26 and the adhesive bead. The adhesive tail will gradually thin until it breaks, as shown in FIG. 3B. The camera 30 is located adjacent to the dispensing nozzle 22 in order to capture a side view of the dispensing tip 26. Thus, the camera 30 is operative to detect or capture not only the breaking of the adhesive tail, but also the exact time when it occurs.

A drop of adhesive 40 may be sufficient for a small bond pad, but a larger quantity of adhesive 40 is usually required to cover a large bond pad. In that case, the dispensing nozzle 22 may be required to move over the whole surface area of the large bond pad while it is dispensing adhesive 40.

Figure 4:
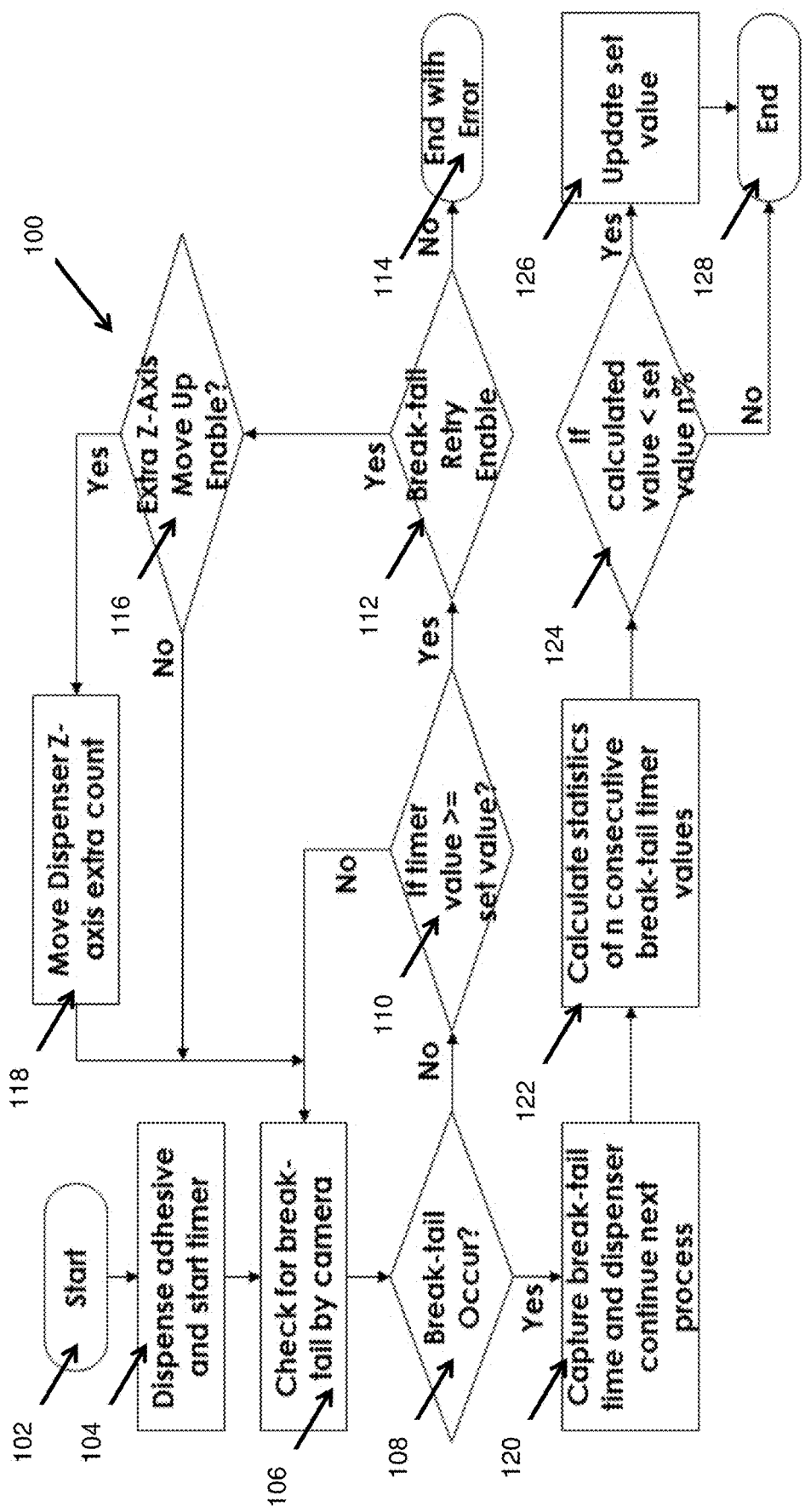
FIG. 4 is a flowchart setting out the steps involved in an exemplary process for dispensing adhesive using the adhesive dispenser module of FIG. 1.

FIG. 4 is a flowchart setting out the steps involved in an exemplary process 100 for dispensing adhesive using the adhesive dispenser module 10 of FIG. 1, and FIGS. 5A-5E illustrate respective side-view images captured by the camera 30 at different stages of the process 100.

Figure 5E:
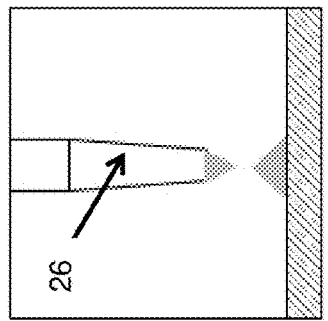
FIGS. 5A-5E illustrate respective side-view images captured by a camera at different stages of the process set out in FIG. 4.

First, at step 102 of the process 100, the dispensing nozzle 22 is moved to a position slightly above an attachment location 44 on the substrate 42. When the dispensing tip 26 of the dispensing nozzle 22 is positioned above the attachment location 44, a drop of adhesive 40 is dispensed from the dispensing tip 26, as shown in FIG. 5A. The dispensed drop of adhesive 40 forms a bead on the substrate 42, as shown in FIG. 5B. A timer is started at step 104 once the drop of adhesive 40 has been dispensed, and then the camera 30 commences from step 106 to check for the breakage of an adhesive tail.

After a correct amount of the adhesive 40 has been dispensed from the dispensing tip 26, the dispensing nozzle 22 moves upwards, pulling a part of the dispensed bead of adhesive 40 upwards along with it. As the dispensing nozzle 22 moves upwards, as shown in FIG. 5C, a portion of the bead of adhesive 40 is drawn upwards and elongates from the adhesive being stretched over an increasing distance. The dispensing nozzle 22 moves up by a predetermined distance, which is specified in a recipe stored in the memory 36 under a user-definable parameter, such as "pull-up distance". After moving the predetermined distance to a rest position, the dispensing nozzle 22 stops and waits at the rest position for a predetermined period of time, which is specified in the recipe stored in the memory 36 under another user-definable parameter, such as "delay".

Figure 5D:
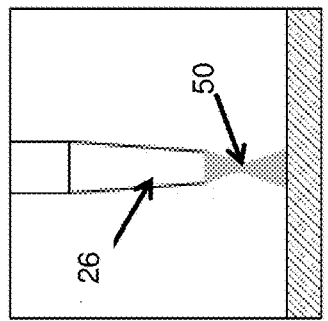
Figure 5C:
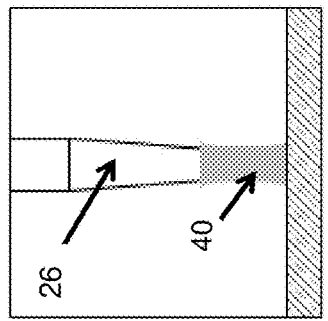
Figure 5B:
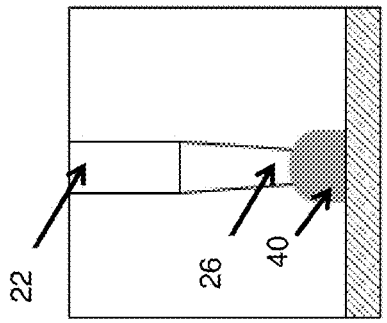
Figure 5A:
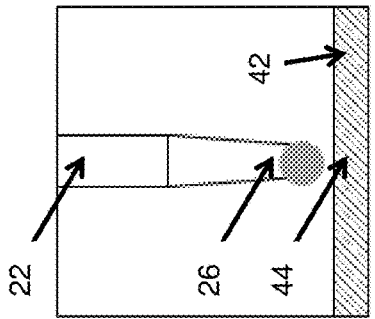

As the dispensing nozzle 22 is moving up to the rest position, an increasing proportion of the adhesive tail is attracted towards the substrate 42 by gravitational pull, and a tail or neck 50 begins to form, as shown in FIG. 5D. The neck 50 continues to thin while more and more of the adhesive 40 sinks downwards, until the neck 50 breaks and tail break occurs, as shown in FIG. 5E.

It should be noted that the adhesive tail break need not occur while the dispensing nozzle 22 is moving to the rest position. It may also occur during the "delay" while the dispensing nozzle 22 is waiting at the rest position. If the dispensing tail does not break at all, it may be a sign of a fault, for instance, the adhesive 40 may have deteriorated in quality to an unacceptable level. In that case, the operator may be prompted to change the adhesive contained in the adhesive chamber 20. Alternatively, the dispensing nozzle 22 may be configured to move to another attachment location immediately after the adhesive tail break has been detected, thus shortening the process time and increasing throughput.

At step 106, the camera 30 checks for the time at which the adhesive tail breaks by capturing images of the dispensing nozzle 22 and the adhesive 40. Then, the processor 34, at step 108, determines whether or not the adhesive tail break has occurred. If the adhesive tail has not yet broken, at step 110, the processor 34 notes the elapsed time since the timer started at step 104 and compares it with a user-definable parameter "maximum time". The process 100 then loops back to step 106 if the elapsed time is shorter than the predefined "maximum time". Otherwise, the process 100 proceeds to step 112 whereby the processor 34 determines whether the conditions allow the adhesive dispenser module 10 to try breaking the adhesive tail again. The conditions are user-defined and may, for example, be whether or not the elapsed time has exceeded a predefined "terminating time limit". If the conditions do not permit the adhesive dispenser module 10 to try breaking the adhesive tail again, the process 100 ends at step 114 with an error message. An operator may then need to take appropriate remedial actions.

However, if the conditions allow the adhesive dispenser module 10 to try breaking the adhesive tail again, at step 116, the processor 34 determines whether or not the dispensing nozzle 22 should be allowed to move up further. If the dispensing nozzle 22 is not allowed to move up further, the process 100 loops back to step 106. Otherwise, the dispensing nozzle 22, at step 118, moves up a further predetermined distance, which is specified in a recipe stored in the processor 34 under a user-definable parameter, such as "further pull-up distance". Thereafter, the process 100 loops back to step 106.

Finally, if at step 108, the camera 30 detects that the adhesive tail break has occurred, at step 120, the processor 34 records the time taken for the adhesive tail break to occur. The adhesive dispenser module 10 may then continue to dispense a next drop of adhesive 40 at another attachment location 44. The time taken for each adhesive tail break to occur is collected into a data set. At step 122, after sufficient data has been collected, the processor 34 carries out a statistical analysis of the data set. At step 124, if the value obtained from the statistical analysis is lower than the current stored value, the stored value is updated at step 126. If not, the process 100 ends at step 128 for a specific dispensing operation.

The aforesaid process 100 not only removes the need for subjective assessment by an operator during the inspection process, it also provides a method of monitoring the high-speed adhesive dispensing process in real time. Furthermore, by allowing the incorporation of statistical analysis into the process 100 in real time, the optimization of the process parameters can be performed more efficiently and with less wastage.

Therefore, if a tail break does not occur within an expected normal tail break timing or the tail break timing is abnormal, the system may modify parameters used for dispensing a next drop of adhesive 40, such as "pull-up speed", "pull-up distance" or "delay". This would help to promote automatic optimization of dispensing parameters, even during the dispensing process itself.

It should be recognized that the specifics of the various processes recited above are provided for illustrative purposes only, and that other processes and materials which provide equivalent results may be substituted therefor.

Although the present invention has been described in considerable detail with reference to certain embodiments, other embodiments are possible.

For example, instead of ending the process 100 with the error message, at step 114, the adhesive dispenser module 10 may proceed to forcefully break the adhesive tail and then dispense a next drop of adhesive 40 at another attachment location 44.

In addition, when prompted, the adhesive chamber 20 itself may be changed instead of the adhesive in the adhesive chamber 20. Furthermore, apart from the time taken for the adhesive tail break to occur, other process parameters may be recorded and statistically analyzed to optimize the process 100. Moreover, in addition to dispensing drops of adhesive 40, the adhesive dispenser module 10 may be configured to dispense adhesive 40 in lines or to areas.

Therefore, the spirit and scope of the appended claims should not be limited to the description of the embodiments contained herein.

The invention claimed is:

1. A method of dispensing a viscous adhesive for attaching a semiconductor die onto a substrate during operations for dispensing the viscous adhesive onto different locations on the substrate, the method comprising the steps of:
   moving a nozzle towards the substrate for dispensing a volume of viscous adhesive from the nozzle onto a first location on the substrate during a respective dispensing operation;
   moving the nozzle away from the substrate such that an adhesive tail is formed between the nozzle and the volume of viscous adhesive;
   capturing multiple images of the adhesive tail and of the nozzle moving away from the substrate with an imaging device during the dispensing operation as the nozzle is moving away from the substrate;
   detecting with the imaging device an instant when the adhesive tail breaks from the volume of viscous adhesive; and thereafter
   moving the nozzle towards the substrate and dispensing another volume of the viscous adhesive onto a second location on the substrate during a subsequent dispensing operation.

2. The method of claim 1, wherein the imaging device is mounted in a fixed relationship to the nozzle such that the imaging device is movable together with the nozzle so as to keep the nozzle within a field of view of the imaging device.

3. The method of claim 1, further comprising the step of recording a time period between an instant when the nozzle starts to move away from the substrate, and the instant when the adhesive tail breaks.

4. The method of claim 3, wherein in response to the time period recorded, further comprising the step of changing a parameter used by the nozzle for dispensing the viscous adhesive.

5. The method of claim 4, wherein the parameter is selected from the group consisting of: a speed at which the nozzle moves away from the substrate, a distance for which the nozzle moves away from the substrate, and a period of time at which the nozzle is at rest after moving away from the substrate.

6. The method of claim 3, further comprising the steps of:
   recording a respective time period for the instance when the adhesive tail breaks when dispensing each volume of viscous adhesive;
   entering a plurality of such time periods into a data set;
   statistically analyzing the data set; and
   changing a parameter used by the nozzle for dispensing the viscous adhesive based on the statistical analysis of the said data set.

7. The method of claim 1, wherein a processor and a memory are embedded in the imaging device for processing the images captured.

8. The method of claim 7, wherein the step of capturing multiple images of the adhesive tail is performed at a rate of 500 frames per second or more.

9. The method of claim 1, further comprising the step of moving the nozzle a horizontal distance over an area of the substrate while dispensing the volume of adhesive so as to dispense the volume of the adhesive to cover the area of the substrate.

10. The method of claim 1, wherein the step of moving the nozzle away from the 15 substrate comprises moving the nozzle away from the substrate by a predetermined distance to a rest position.

11. The method of claim 10, further comprising the step of keeping the nozzle at the rest position for a predetermined period of time.

12. The method of claim 9, further comprising the step of moving the nozzle further away from the substrate after keeping the nozzle at the rest position for the predetermined period of time.

* * * * *